US009455416B2

(12) United States Patent
Diez et al.

(10) Patent No.: US 9,455,416 B2
(45) Date of Patent: Sep. 27, 2016

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Carola Diez, Regensburg (DE); Arndt Jaeger, Regensburg (DE); Erwin Lang, Regensburg (DE); Ulrich Niedermeier, Leiblfing (DE); Nina Riegel, Tegernheim (DE); Guenter Schmid, Hemhofen (DE); Stefan Seidel, Wenzenbach (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/401,136

(22) PCT Filed: Apr. 22, 2013

(86) PCT No.: PCT/EP2013/058309
§ 371 (c)(1),
(2) Date: Nov. 14, 2014

(87) PCT Pub. No.: WO2013/171031
PCT Pub. Date: Nov. 21, 2013

(65) Prior Publication Data
US 2015/0102311 A1 Apr. 16, 2015

(30) Foreign Application Priority Data

May 16, 2012 (DE) .................. 10 2012 208 235

(51) Int. Cl.
H01L 21/00 (2006.01)
H01L 29/08 (2006.01)
(Continued)

(52) U.S. Cl.
CPC ....... H01L 51/5092 (2013.01); H01L 51/5278 (2013.01); H01L 51/56 (2013.01)

(58) Field of Classification Search
None
See application file for complete search history.

(56) References Cited

U.S. PATENT DOCUMENTS 8,698,392 B2 4/2014 Furukawa et al.
8,766,291 B2 7/2014 Forrest et al.
(Continued)

FOREIGN PATENT DOCUMENTS

CN 1703128 A 11/2005
CN 102097456 A 6/2011
(Continued)

OTHER PUBLICATIONS

International Search Report of PCT/EP2013/058309 dated Sep. 13, 2013.
(Continued)

Primary Examiner — Calvin Choi

(57) ABSTRACT

An optoelectronic component may include a first organic functional layer structure, a second organic functional layer structure, and a charge generating layer structure between the first organic functional layer structure and the second organic functional layer structure. The charge generating layer structure includes a first electron-conducting charge generating layer, and a second electron-conducting charge generating layer. The second electron-conducting charge generating layer is formed from a single substance, and the substance of the first electron-conducting charge generating layer is a substance selected from the group of substances consisting of: HAT-CN, Cu(I)pFBz, NDP-2, NDP-9, Bi(III) pFBz, F16CuPc.

17 Claims, 6 Drawing Sheets

(51) Int. Cl.
  *H01L 35/24* (2006.01)
  *H01L 51/00* (2006.01)
  *H01L 51/50* (2006.01)
  *H01L 51/52* (2006.01)
  *H01L 51/56* (2006.01)

(56) References Cited

U.S. PATENT DOCUMENTS

| | | |
|---|---|---|
| 2005/0260451 A1 | 11/2005 | Kijima |
| 2011/0133226 A1 | 6/2011 | Lee et al. |
| 2011/0215714 A1* | 9/2011 | Seo .................. C09K 11/06 313/504 |
| 2011/0240971 A1 | 10/2011 | Nowatari et al. |
| 2011/0315968 A1 | 12/2011 | Nowatari et al. |
| 2012/0012820 A1 | 1/2012 | Endo et al. |
| 2012/0080667 A1* | 4/2012 | Nowatari ............... C09K 11/06 257/40 |

FOREIGN PATENT DOCUMENTS

| | | |
|---|---|---|
| EP | 1983805 A1 | 10/2008 |
| WO | 2010062643 A1 | 6/2010 |

OTHER PUBLICATIONS

Chinese Office Action based on Application No. 201380037908.3 (11 Pages) dated Jan. 26, 2016 (Deference Purpose Only).

* cited by examiner

OPTOELECTRONIC COMPONENT AND METHOD FOR PRODUCING AN OPTOELECTRONIC COMPONENT

RELATED APPLICATIONS

The present application is a national stage entry according to 35 U.S.C. §371 of PCT application No.: PCT/EP2013/058309 filed on Apr. 22, 2013, which claims priority from German application No.: 10 2012 208 235.2 filed on May 16, 2012, and is incorporated herein by reference in its entirety.

TECHNICAL FIELD

Various embodiments relate to an optoelectronic component and a method for producing an optoelectronic component.

BACKGROUND

An optoelectronic component (e.g. an organic light emitting diode (OLED), for example a white organic light emitting diode (WOLED), a solar cell, etc.) on an organic basis is usually distinguished by its mechanical flexibility and moderate production conditions. Compared with a component composed of inorganic materials, an optoelectronic component on an organic basis can be produced potentially cost-effectively on account of the possibility of large-area production methods (e.g. roll-to-roll production methods).

A WOLED consists e.g. of an anode and a cathode with a functional layer system therebetween. The functional layer system consists of one or a plurality of emitter layer/s, in which the light is generated, one or a plurality of charge generating layer structure/s each composed of two or more charge generating layers (CGL) for generating charge, and one or a plurality of electron blocking layers, also designated as hole transport layer(s) (HTL), and one or a plurality of hole blocking layers, also designated as electron transport layer(s) (ETL), in order to direct the current flow.

In the simplest embodiment, the charge generating layer structure conventionally consists of a hole-conducting charge generating layer and a second electron-conducting charge generating layer, which are directly connected to one another, with the result that illustratively a pn junction is formed. In the pn junction, a space charge zone is formed, in which electrons of the hole-conducting charge generating layer migrate into the first and the second electron-conducting charge generating layer, wherein the second electron-conducting charge generating layer is an n-doped charge generating layer. As a result of a voltage being applied to the pn junction in the reverse direction, in the space charge zone electrons and holes are generated which migrate into the emitter layers and can generate electromagnetic radiation as a result of recombination (e.g. light).

An OLED can be produced with good efficiency and lifetime by means of conductivity doping by the use of a p-i-n (p-doped-intrinsic-n-doped) junction analogously to the conventional inorganic LED. In this case, the charge carriers from the p-doped and respectively n-doped layers are injected in a targeted manner into the intrinsic layer, in which the excitons, i.e. electron-hole pairs, are formed.

By stacking one or a plurality of intrinsic layers one above another, it is possible to obtain in the OLED, with practically the same efficiency and identical luminance, significantly longer lifetimes compared with an OLED including only one intrinsic layer. For the same current density, double to triple the luminance can thus be realized. For the stacking one above another, charge generating layers consisting of a highly doped pn junction are required.

The hole-conducting and electron-conducting charge generating layers may each consist of one or a plurality of organic and/or inorganic substance(s). In the production of the charge generating layer, the respective matrix is usually admixed with one or a plurality of organic or inorganic substances (dopants) in order to increase the conductivity of the matrix. This doping can produce electrons (n-doped; dopants e.g. metals having a low work function, e.g. Na, Ca, Cs, Li, Mg or compounds thereof e.g. $Cs_2CO_3$, $Cs_3PO_4$, or organic dopants from the company NOVALED, e.g. NDN-1, NDN-26) or holes (p-doped; dopant e.g. transition metal oxides, e.g. $MoO_x$, $WO_x$, $VO_x$, organic compounds, e.g. Cu(I)pFBz, F4-TCNQ, or organic dopants from the company NOVALED, e.g. NDP-2, NDP-9) as charge carriers in the matrix.

SUMMARY

In the context of this description, an organic substance may be understood to mean a carbon compound which, regardless of the respective state of matter, is present in chemically uniform form and is characterized by characteristic physical and chemical properties. Furthermore, in the context of this description, an inorganic substance may be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) may be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture may be understood to mean something which has constituents consisting of two or more different substances, the constituents of which are very finely dispersed, for example.

In various embodiments, an electron-conducting layer of an electronic component may be understood to mean a layer in which the chemical potential of the substance or of the substance mixture of the layer is energetically closer to the conduction band than to the valence band, and in which more than half of the freely mobile charge carriers are electrons.

In various embodiments, a hole-conducting layer of an electronic component may be understood to mean a layer in which the chemical potential of the substance or of the substance mixture of the layer is energetically closer to the valence band than to the conduction band and in which more than half of the freely mobile charge carriers are holes, i.e. free orbital sites for electrons.

With the use of matrix and dopants (substance mixture) for the hole-conducting or electron-conducting charge generating layer, a plurality of different substance sources are required for the production thereof. The dopants are generally very reactive and may react to completion and become inactive in an uncontrolled manner during layer production. This reduces the effective doping and increases the process outlay and the number of fault sources in the production of the charge generating layers. The use of different substances for the matrix and doping for the hole-conducting and electron-conducting charge generating layers increases the required number of substance sources. This results in a high outlay in terms of costs in the provision and maintenance of these substance sources (e.g. energy consumption of the substance sources for evaporation, platinum boats in evaporation installations, etc.).

In various embodiments, an optoelectronic component and a method for producing it are provided in which only one substance source is required for producing the electron-conducting charge generating layer.

In the context of this description, an organic substance may be understood to mean a carbon compound which, regardless of the respective state of matter, is present in chemically uniform form and is characterized by characteristic physical and chemical properties. Furthermore, in the context of this description, an inorganic substance may be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) may be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example.

In various embodiments an optoelectronic component is provided, including: a first organic functional layer structure; a second organic functional layer structure; and a charge generating layer structure between the first organic functional layer structure and the second organic functional layer structure, wherein the charge generating layer structure includes: a hole-conducting charge generating layer; a first electron-conducting charge generating layer and a second electron-conducting charge generating layer, wherein the second electron-conducting charge generating layer is formed from a single substance, and wherein the hole-conducting charge generating layer is designed as a hole transport layer of the second organic functional layer structure.

In one configuration, a hole-conducting charge generating layer may include or may be formed from an intrinsically hole-conducting substance, wherein the hole-conducting charge generating layer is embodied as a hole transport layer as part of the second organic functional layer structure and is in physical contact with the first electron-conducting charge generating layer. Charge carrier pairs can be generated at the common interface of the first charge generating layer with the hole transport layer or hole-conducting charge generating layer.

In another configuration, the hole-conducting charge generating layer or hole transport layer may include or may be formed from a substance from the group of the following substances:
NPB (N,N'-bis(naphthalen-1-yl)-N,N'-bis(phenyl)benzidine);
beta-NPB N,N'-bis(naphthalen-2-yl)-N,N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine);
spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);
DMFL-NPB (N,N'-bis(naphthalen-1-yl)-N,N'-bis(phenyl)-9,9-dimethylfluorene);
DPFL-TPD (N,N'-bis(3-methylphenyl)-N,N'-bis(phenyl)-9,9-diphenylfluorene);
DPFL-NPB (N,N'-bis(naphthalen-1-yl)-N,N'-bis(phenyl)-9,9-diphenylfluorene);
spiro-TAD (2,2',7,7'-tetrakis(N,N-diphenylamino)-9,9'-spirobifluorene);
9,9-bis[4-(N,N-bis-biphenyl-4-yl-amino)phenyl]-9H-fluorene;
9,9-bis[4-(N,N-bis-naphthalen-2-yl-amino)phenyl]-9H-fluorene;
9,9-bis[4-(N,N'-bis-naphthalen-2-yl-N,N'-bis-phenylamino)phenyl]-9H-fluorene;
N,N'-bis(phenanthren-9-yl)-N,N'-bis(phenyl)benzidine;
2,7-bis[N,N-bis(9,9-spiro-bifluoren-2-yl)amino]-9,9-spiro-bifluorene;
2,2'-bis[N,N-bis(biphenyl-4-yl)amino]9,9-spiro-bifluorene;
2,2'-bis(N,N-diphenylamino)-9,9-spiro-bifluorene;
di-[4-(N,N-ditolylamino)phenyl]cyclohexane;
2,2',7,7'-tetra(N,N-ditolyl)amino-spiro-bifluorene; and
N,N,N',N'-tetra-naphthalen-2-yl-benzidine.

In another configuration, the hole transport layer or the hole-conducting charge generating layer can be formed from a substance mixture composed of matrix and p-dopant.

In another configuration, the matrix of the hole transport layer or of the hole-conducting charge generating layer can be a substance selected from the group of substances consisting of:
NPB (N,N'-bis(naphthalen-1-yl)-N,N'-bis(phenyl)benzidine);
beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine);
spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);
DMFL-NPB (N,N'-bis(naphthalen-1-yl)-N,N'-bis(phenyl)-9,9-dimethylfluorene);
DPFL-TPD (N,N'-bis(3-methylphenyl)-N,N'-bis(phenyl)-9,9-diphenylfluorene);
DPFL-NPB (N,N'-bis(naphthalen-1-yl)-N,N'-bis(phenyl)-9,9-diphenylfluorene);
spiro-TAD (2,2',7,7'-tetrakis(N,N-diphenylamino)-9,9'-spirobifluorene);
9,9-bis[4-(N,N-bis-biphenyl-4-yl-amino)phenyl]-9H-fluorene;
9,9-bis[4-(N,N-bis-naphthalen-2-yl-amino)phenyl]-9H-fluorene;
9,9-bis[4-(N,N'-bis-naphthalen-2-yl-N,N'-bis-phenylamino)phenyl]-9H-fluorene;
N,N'-bis(phenanthren-9-yl)-N,N'-bis(phenyl)benzidine;
2,7-bis[N,N-bis(9,9-spiro-bifluoren-2-yl)amino]-9,9-spiro-bifluorene;
2,2'-bis[N,N-bis(biphenyl-4-yl)amino]9,9-spiro-bifluorene;
2,2'-bis(N,N-diphenylamino)-9,9-spiro-bifluorene;
di-[4-(N,N-ditolylamino)phenyl]cyclohexane;

2,2',7,7'-tetra(N,N-ditolyl)amino-spiro-bifluorene; and N,N,N',N'-tetra-naphthalen-2-yl-benzidine.

In another configuration, the dopant of the hole-conducting charge generating layer or hole transport layer can be a substance selected from the group of substances consisting of: HAT-CN, Cu(I)pFBz, $MoO_x$, $WO_x$, $VO_x$, $ReO_x$, F4-TCNQ, NDP-2, NDP-9, Bi(III)pFBz, F16CuPc.

In another configuration, the substance of the hole-conducting charge generating layer can be an intrinsic hole conductor in such a way that the valence band thereof is approximately equal to the conduction band of the substance of the first electron-conducting charge generating layer.

In another configuration, the hole-conducting charge generating layer can have a layer thickness in a range of approximately 1 nm to approximately 500 nm.

In one configuration, the first electron-conducting charge generating layer can be an intrinsic hole-conducting charge generating layer.

In one configuration, the first electron-conducting charge generating layer can be an intrinsic electron-conducting charge generating layer.

In another configuration, the substance of the hole-conducting charge generating layer can be an intrinsic hole conductor whose valence band is approximately equal to the conduction band of the substance of the first electron-conducting charge generating layer.

In another configuration, the substance of the first electron-conducting charge generating layer can be a substance selected from the group of substances consisting of: HAT-CN, Cu(I)pFBz, $MoO_x$, $WO_x$, $VO_x$, $ReO_x$, F4-TCNQ, NDP-2, NDP-9, Bi(III)pFBz, F16CuPc.

In another configuration, the first electron-conducting charge generating layer can have a layer thickness in a range of approximately 1 nm to approximately 500 nm.

In another configuration, the substance of the second electron-conducting charge generating layer can be an intrinsic electron conductor whose valence band is energetically approximately equal to the conduction band of the substance of the first electron-conducting charge generating layer.

In another configuration, the substance of the second electron-conducting charge generating layer can be a substance selected from the group of substances consisting of: NDN-26, MgAg, $Cs_2CO_3$, $Cs_3PO_4$, Na, Ca, K, Mg, Cs, Li, LiF.

In another configuration, the second electron-conducting charge generating layer can have a layer thickness in a range of approximately 1 nm to approximately 500 nm.

In another configuration, the optoelectronic component may furthermore include an interlayer arranged between the first electron-conducting charge generating layer and the second electron-conducting charge generating layer.

In another configuration, the interlayer can have a layer thickness in a range of approximately 2 nm to approximately 10 nm.

In another configuration, the interlayer may include a phthalocyanine derivative, for example a metal phthalocyanine derivative, for example a metal oxide phthalocyanine derivative.

In another configuration, the interlayer may include vanadium oxide phthalocyanine (VOPc), titanium oxide phthalocyanine (TiOPc), copper phthalocyanine (CuPc), unsubstituted phthalocyanine ($H_2Pc$), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPc).

In another configuration, the optoelectronic component may furthermore include a hole transport layer arranged on or above the hole-conducting charge generating layer; and an electron transport layer; wherein the electron-conducting charge generating layer is arranged on or above the electron transport layer.

In another configuration, the optoelectronic component may furthermore include: a first electrode; wherein the first organic functional layer structure is arranged on or above the first electrode; and a second electrode; wherein the second electrode is arranged on or above the second organic functional layer structure.

In another configuration, the total layer thickness of the first electrode, of the first organic functional layer structure, of the charge generating layer structure, of the second organic functional layer structure, and of the second electrode can be in a range of approximately 5 nm to approximately 5000 nm.

In another configuration, the optoelectronic component can be designed as an organic light emitting diode.

In various embodiments, a method for producing an optoelectronic component is provided. The method may include: forming a first organic functional layer structure; forming a charge generating layer structure on or above the first organic functional layer structure; forming a second organic functional layer structure on or above the charge generating layer structure; wherein forming the charge generating layer structure includes the following method steps: forming an electron-conducting charge generating layer on or above the first organic functional layer structure, wherein the electron-conducting charge generating layer is formed from a single substance; forming a hole-conducting charge generating layer on or above the electron-conducting charge generating layer.

In one configuration of the method, the hole-conducting charge generating layer or hole transport layer may include or be formed from an intrinsically hole-conducting substance, wherein the hole-conducting charge generating layer or hole transport layer is part of the second organic functional layer structure and charge carrier pairs are generated and separated at the common interface of the hole-conducting charge generating layer and the first electron-conducting charge generating layer.

In another configuration of the method, the hole-conducting charge generating layer may include or be formed from a substance from the group of the following substances:
NPB (N,N'-bis(naphthalen-1-yl)-N,N'-bis(phenyl)benzidine);
beta-NPB N,N'-bis(naphthalen-2-yl)-N,N'-bis(phenyl) benzidine); TPD (N,N'-bis(3-methylphenyl)-N,N'-bis (phenyl)benzidine); spiro TPD (N,N'-bis(3-methylphenyl)-N,N'-bis(phenyl)benzidine);
spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);
DMFL-NPB (N,N'-bis(naphthalen-1-yl)-N,N'-bis(phenyl)-9,9-dimethylfluorene);
DPFL-TPD (N,N'-bis(3-methylphenyl)-N,N'-bis(phenyl)-9,9-diphenylfluorene);
DPFL-NPB (N,N'-bis(naphthalen-1-yl)-N,N'-bis(phenyl)-9,9-diphenylfluorene);
spiro-TAD (2,2',7,7'-tetrakis(N,N-diphenylamino)-9,9'-spirobifluorene);
9,9-bis[4-(N,N-bis-biphenyl-4-yl-amino)phenyl]-9H-fluorene;
9,9-bis[4-(N,N-bis-naphthalen-2-yl-amino)phenyl]-9H-fluorene;

9,9-bis[4-(N,N'-bis-naphthalen-2-yl-N,N'-bis-phenylamino)phenyl]-9H-fluorene;
N,N'-bis(phenanthren-9-yl)-N,N'-bis(phenyl)benzidine;
2,7-bis[N,N-bis(9,9-spiro-bifluoren-2-yl)amino]-9,9-spiro-bifluorene;
2,2'-bis[N,N-bis(biphenyl-4-yl)amino]9,9-spiro-bifluorene;
2,2'-bis(N,N-diphenylamino)-9,9-spiro-bifluorene;
di-[4-(N,N-ditolylamino)phenyl]cyclohexane;
2,2',7,7'-tetra(N,N-ditolyl)amino-spiro-bifluorene; and
N,N,N',N'-tetra-naphthalen-2-yl-benzidine.

In another configuration of the method, the hole-conducting charge generating layer can be formed from a substance mixture composed of matrix and p-type dopant.

In another configuration of the method, for the matrix of the hole-conducting charge generating layer it is possible to use a substance selected from the group of substances consisting of:

NPB (N,N'-bis(naphthalen-1-yl)-N,N'-bis(phenyl)benzidine);
beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine);
spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);
DMFL-NPB (N,N'-bis(naphthalen-1-yl)-N,N'-bis(phenyl)-9,9-dimethylfluorene);
DPFL-TPD (N,N'-bis(3-methylphenyl)-N,N'-bis(phenyl)-9,9-diphenylfluorene);
DPFL-NPB (N,N'-bis(naphthalen-1-yl)-N,N'-bis(phenyl)-9,9-diphenylfluorene);
spiro-TAD (2,2',7,7'-tetrakis(N,N-diphenylamino)-9,9'-spirobifluorene);
9,9-bis[4-(N,N-bis-biphenyl-4-yl-amino)phenyl]-9H-fluorene;
9,9-bis[4-(N,N-bis-naphthalen-2-yl-amino)phenyl]-9H-fluorene;
9,9-bis[4-(N,N'-bis-naphthalen-2-yl-N,N'-bis-phenylamino)phenyl]-9H-fluorene;
N,N'-bis(phenanthren-9-yl)-N,N'-bis(phenyl)benzidine;
2,7-bis[N,N-bis(9,9-spiro-bifluoren-2-yl)amino]-9,9-spiro-bifluorene;
2,2'-bis[N,N-bis(biphenyl-4-yl)amino]9,9-spiro-bifluorene;
2,2'-bis(N,N-diphenylamino)-9,9-spiro-bifluorene;
di-[4-(N,N-ditolylamino)phenyl]cyclohexane;
2,2',7,7'-tetra(N,N-ditolyl)amino-spiro-bifluorene; and
N,N,N',N'-tetra-naphthalen-2-yl-benzidine.

In another configuration of the method, as dopant of the hole-conducting charge generating layer it is possible to select a substance from the group of substances consisting of: HAT-CN, Cu(I)pFBz, $MoO_x$, $WO_x$, $VO_x$, $ReO_x$, F4-TCNQ, NDP-2, NDP-9, Bi(III)pFBz, F16CuPc.

In another configuration of the method, the hole-conducting charge generating layer can be formed with a layer thickness in a range of approximately 1 nm to approximately 500 nm.

In one configuration of the method, the substance of the first electron-conducting charge generating layer may include or be formed from an intrinsically electron-conducting substance.

In another configuration of the method, the substance of the first intrinsically electron-conducting charge generating layer may include or be formed from a substance from the group of the following substances: HAT-CN, Cu(I)pFBz, $MoO_x$, $WO_x$, $VO_x$, $ReO_x$, F4-TCNQ, NDP-2, NDP-9, Bi(III)pFBz, F16CuPc.

In another configuration of the method, the conduction band of the substance or substance mixture of the first electron-conducting charge generating layer can be made energetically approximately equal to the valence band of the substance or substance mixture of the hole-conducting charge generating layer in physical contact and energetically approximately equal to the valence band of the substance or substance mixture of the second electron-conducting charge generating layer.

In another configuration, the substance of the second electron-conducting charge generating layer can be a substance selected from the group of substances consisting of: NDN-26, MgAg, $Cs_2CO_3$, $Cs_3PO_4$, Na, Ca, K, Mg, Cs, Li, LiF.

In another configuration, the second electron-conducting charge generating layer can be formed with a layer thickness in a range of approximately 1 nm to approximately 500 nm.

The thickness of the pn junction is dependent on the combination of the substance or substance mixtures of the charge generating layers. By way of example, a thin space charge zone, relative to the thickness of the hole-conducting and electron-conducting charge generating layers, is provided in various embodiments can be achieved for example by means of the use of HAT-CN and NDN-26 or HAT-CN and MgAg.

In a manner similar to inorganic layers at high temperatures in the manufacture of semiconductor components, for example at temperatures of greater than 200° C., during manufacture and during operation even at temperatures of less than 100° C. organic layers can diffuse into other layers (partial layer interdiffusion), e.g. parts of the second electron-conducting charge generating layer into the first-electron-conducting charge generating layer of a charge generating layer structure in an OLED.

In another configuration, the method may furthermore include forming a diffusion barrier or interlayer between the second electron-conducting charge generating layer and the first electron-conducting charge generating layer.

In this case, the interlayer prevents the layer interdiffusion, for example of the dopant or of the matrix substance. Furthermore, the interlayer can prevent a reaction of the second electron-conducting charge generating layer with the first electron-conducting charge generating layer, i.e. the interlayer forms a reaction barrier. Furthermore, the interlayer can reduce the interfacial roughness between the second electron-conducting charge generating layer and the first electron-conducting charge generating layer by the surface roughness of the second electron-conducting charge generating layer being reduced or compensated for by means of the interlayer.

If the substance of the first electron-conducting charge generating layer or of the second electron-conducting charge generating layer is inorganic, an interlayer may not be necessary.

The interlayer can consist of a primarily organic or inorganic substance or substance mixture, wherein in the case of an interlayer composed of an organic substance or substance mixture the glass transition temperature is very much lower than the operating temperature of the optoelectronic component. However, the substance can also consist of a hybrid substance including primarily organic and primarily inorganic molecular regions. The molecular region is a chemically similar and continuous section of the molecule of the multiplicity of which a or the substance of the layer consists.

The charge carrier conduction through the interlayer can take place directly or indirectly.

The substance or the substance mixture of the interlayer can be an electrical insulator in the case of indirect charge carrier conduction. The HOMO of the insulating substance of the interlayer can be higher than the LUMO of the directly adjacent first electron-conducting charge generating layer and higher than the HOMO of the directly adjacent second electron-conducting charge generating layer. A tunneling current through the interlayer can take place as a result.

In the case of direct charge carrier conduction, the interlayer can consist of a substance or substance mixture having high electrical conductivity relative to the directly adjacent layers.

In another configuration, the interlayer can be formed with a layer thickness in a range of approximately 2 nm to approximately 10 nm.

In one embodiment, the interlayer is distinguished by a high transmission of light (>90%) in the wavelength range of 450 nm to 650 nm, a high thermal stability of the interlayers up to 120° C. and a high tunneling current.

In another configuration, the interlayer may include a metal phthalocyanine derivative or a metal oxide phthalocyanine derivative.

In another configuration, the interlayer may include a vanadium oxide phthalocyanine, titanium oxide phthalocyanine, copper phthalocyanine.

In another configuration, the method may furthermore include: forming an electron transport layer; forming the second electron-conducting charge generating layer on or above the electron transport layer; and forming a hole transport layer or hole-conducting charge generating layer on or above the first electron-conducting charge generating layer.

In another configuration, the method may furthermore include: forming a first electrode; forming the first organic functional layer structure on or above the first electrode; and forming a second electrode on or above the second organic functional layer structure.

In another configuration, the first electrode, the first organic functional layer structure, the charge generating layer structure, the second organic functional layer structure, and the second electrode can be formed with a total layer thickness in a range of approximately 5 nm to approximately 2000 nm.

In another configuration, the second electron-conducting charge generating layer can be formed on the first organic functional layer structure; and the conductivity of the electron-conducting charge generating layer can be increased.

In another configuration, the first electron-conducting charge generating layer can be formed on the second electron-conducting charge generating layer or an interlayer; and the conductivity of the first electron-conducting charge generating layer can be increased.

In one configuration, the second electron-conducting charge generating layer can be formed on the first organic functional layer structure, wherein the conductivity of the electron-conducting charge generating layer is increased; and/or the first electron-conducting charge generating layer is formed on the second electron-conducting charge generating layer or an interlayer, wherein the conductivity of the second electron-conducting charge generating layer is increased.

The charge generating layer composed of a single substance can be produced in a state with relatively low conductivity and relatively low reactivity on or above a layer. This state is designated as inactive, e.g. producing an inactive second electron-conducting charge generating layer on an electron transport layer. The inactive charge generating layer can be produced by means of conventional chemical and physical methods (physical vapor deposition, (PVD); chemical vapor deposition (CVD); molecular beam epitaxy (MBE)) or the like. Directly after the production of the inactive charge generating layer or after the production of further layers on the inactive charge generating layer, the inactive charge generating layer can be chemically activated by means of the supply of energy (e.g. by means of ring opening reactions).

By means of the chemical activation, the inactive charge generating layer having relatively low conductivity becomes the active charge generating layer having relatively high intrinsic conductivity.

In another configuration, the conductivity can be increased by means of irradiation with electromagnetic radiation.

In another configuration, the conductivity can be increased by means of irradiation with x-ray radiation or UV radiation.

In another configuration, the conductivity can be increased by means of the action of a temperature change.

In another configuration, the temperature change can be effected by means of a temperature increase.

In another configuration, the temperature increase can be carried out up to a temperature of approximately 150°.

In another configuration, the optoelectronic component can be produced as an organic light emitting diode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component can be embodied as a light emitting component, for example as an organic light emitting diode (OLED) or as an organic light emitting transistor. In various embodiments, the optoelectronic component can be part of an integrated circuit. Furthermore, a plurality of light emitting components can be provided, for example in a manner accommodated in a common housing. In various embodiments, the optoelectronic component can also be embodied as a solar cell. Even though the various embodiments are described below on the basis of an OLED, these embodiments can, however, readily also be applied to the other optoelectronic components mentioned above.

Figure 1:
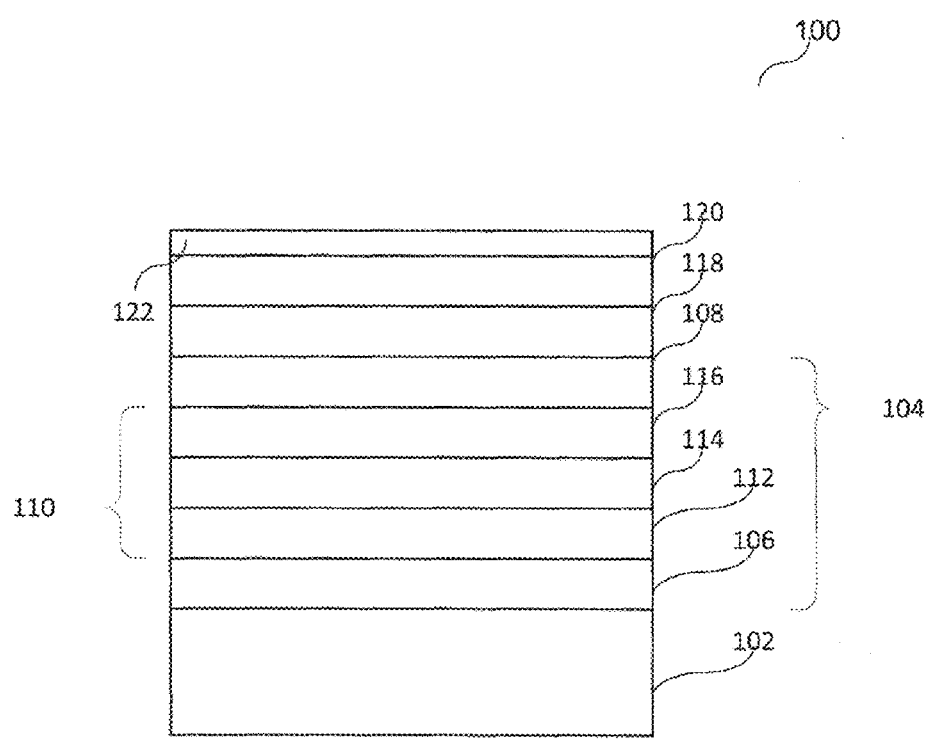
FIG. 1 shows a cross-sectional view of an optoelectronic component in accordance with various embodiments.

FIG. 1 shows a cross-sectional view of an optoelectronic component 100 in accordance with various embodiments.

The optoelectronic component 100 in the form of a light emitting component, for example in the form of an organic light emitting diode 100, can have a substrate 102. The substrate 102 can serve for example as a carrier element for electronic elements or layers, for example light emitting elements. By way of example, the substrate 102 may include or be formed from glass, quartz, and/or a semiconductor material or any other suitable material. Furthermore, the substrate 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). The substrate 102 may include one or more of the materials mentioned above. The substrate 102 can be embodied as translucent or even transparent.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) can be designed as a so-called top and bottom emitter. A top and bottom emitter can also be designated as an optically transparent component, for example a transparent organic light emitting diode.

In various embodiments, a barrier layer (not illustrated) can optionally be arranged on or above the substrate 102. The barrier layer may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 104 of the light emitting component 100 can be arranged on or above the barrier layer. The electrically active region 104 can be understood as that region of the light emitting component 100 in which an electric current for the operation of the optoelectronic component, for example of the light emitting component 100, flows. In various embodiments, the electrically active region 104 can have a first electrode 106, a second electrode 108 and a functional layer system 110, as will be explained in even greater detail below.

In this regard, in various embodiments, the first electrode 106 (for example in the form of a first electrode layer 106) can be applied on or above the barrier layer (or on or above the substrate 102 if the barrier layer is not present). The first electrode 106 (also designated hereinafter as bottom electrode 106) can be formed from an electrically conductive material, such as, for example, a metal or a transparent conductive oxide (TCO) or a layer stack including a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 106 may include a metal; for example Ag, Pt, Au, Mg, Al, Ba, In, Ag, Au, Mg, Ca, Sm or Li, and compounds, combinations or alloys of these materials.

In various embodiments, the first electrode 106 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 106 can provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 106 may include electrically conductive polymers or transition metal oxides or transparent electrically conductive oxides.

In various embodiments, the first electrode 106 and the substrate 102 can be formed as translucent or transparent. In the case where the first electrode 106 is formed from a metal, the first electrode 106 can have for example a layer thickness of less than or equal to approximately 25 nm, for example a layer thickness of less than or equal to approximately 20 nm, for example a layer thickness of less than or equal to approximately 18 nm. Furthermore, the first electrode 106 can have for example a layer thickness of greater than or equal to approximately 10 nm, for example a layer thickness of greater than or equal to approximately 15 nm. In various embodiments, the first electrode 106 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 106 is formed from a transparent conductive oxide (TCO), the first electrode 106 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 106 is formed from, for example, a network composed of metallic nanowires, for example composed of Ag, which can be combined with conductive polymers, a network composed of carbon nanotubes which can be combined with conductive polymers, or from graphene layers and composites, the first electrode 106 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 106 can be formed as an anode, that is to say as a hole-injecting electrode, or as a cathode, that is to say as an electron-injecting electrode.

The first electrode 106 can have a first electrical terminal, to which a first electrical potential (provided by an energy source (not illustrated), for example a current source or a voltage source) can be applied. Alternatively, the first electrical potential can be applied to the substrate 102 and then be fed indirectly to the first electrode 106 via said substrate.

The first electrical potential can be, for example, the ground potential or some other predefined reference potential.

Furthermore, the electrically active region 104 of the light emitting component 100 can have a functional layer system 110, also designated as an organic electroluminescent layer structure 110, which is applied on or above the first electrode 106.

The organic electroluminescent layer structure 110 may include a plurality of organic functional layer structures 112, 116. In various embodiments, the organic electroluminescent layer structure 110 may, however, also include more than two organic functional layer structures, for example 3, 4, 5, 6, 7, 8, 9, 10, or even more.

A first organic functional layer structure 112 and a second organic functional layer structure 116 are illustrated in FIG. 1.

The first organic functional layer structure 112 can be arranged on or above the first electrode 106. Furthermore, the second organic functional layer structure 116 can be arranged on or above the first organic functional layer structure 112. In various embodiments, a charge generating layer structure 114 (charge generation layer, CGL) can be arranged between the first organic functional layer structure 112 and the second organic functional layer structure 116. In embodiments in which more than two organic functional layer structures are provided, a respective charge generating layer structure can be provided between in each case two organic functional layer structures.

As will be explained in even greater detail below, each of the organic functional layer structures 112, 116 may include in each case one or a plurality of emitter layers, for example including fluorescent and/or phosphorescent emitters, and one or a plurality of hole-conducting layers (not illustrated in FIG. 1) (also designated as hole transport layer(s)). In various embodiments, one or a plurality of electron-conducting layers (also designated as electron transport layer(s)) can alternatively or additionally be provided.

Examples of emitter materials which can be used in the light emitting component 100 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) of the light emitting component 100 can be selected for example such that the light emitting component 100 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation. Moreover, the emitter materials of different organic functional layer structures can be chosen such that although the individual emitter materials emit light of different colors (for example blue, green or red or arbitrary other color combinations, for example arbitrary other complementary color combinations), for example the overall light which is emitted overall by all the organic functional layer structures and is emitted toward the outside by the OLED is a light of predefined color, for example white light.

The organic functional layer structures 112, 116 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 110 may include one or a plurality of electroluminescent layers embodied as a hole transport layer, so as to enable for example in the case of an OLED an effective hole injection into an electroluminescent layer or an electroluminescent region. Alternatively, in various embodiments, the organic functional layer structures 112, 116 may include one or a plurality of functional layers embodied as an electron transport layer, so as to enable for example in an OLED an effective electron injection into an electroluminescent layer or an electroluminescent region. By way of example, tertiary amines, carbazo derivatives, conductive polyaniline or polyethylene dioxythiophene can be used as material for the hole transport layer. In various embodiments, the one or the plurality of electroluminescent layers can be embodied as an electroluminescent layer.

Figure 2:
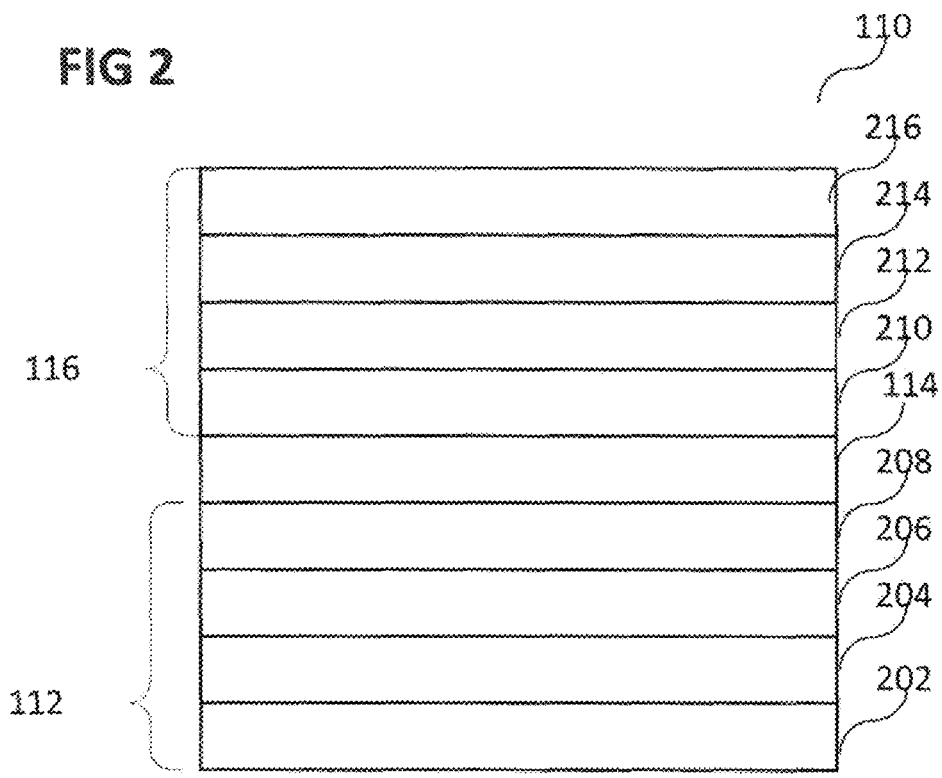
FIG. 2 shows a cross-sectional view of a functional layer system of an optoelectronic component in accordance with various embodiments.

As illustrated in FIG. 2, in various embodiments, the first organic functional layer structure 112 may include a hole injection layer 202, which can be applied, for example deposited, on or above the first electrode 106. In various embodiments, the hole injection layer 202 may include or consist of one or more of the following materials:

HAT-CN, Cu(I)pFBz, $MoO_x$, $WO_x$, $VO_x$, $ReO_x$, F4-TCNQ, NDP-2, NDP-9, bi(III)pFBz, F16CuPc;

NPB (N,N'-bis(naphthalen-1-yl)-N,N'-bis(phenyl)benzidine);

beta-NPB N,N'-bis(naphthalen-2-yl)-N,N'-bis(phenyl) benzidine); TPD (N,N'-bis(3-methylphenyl)-N,N'-bis (phenyl)benzidine); spiro TPD (N,N'-bis(3-methylphenyl)-N,N'-bis(phenyl)benzidine);

spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);

DMFL-NPB (N,N'-bis(naphthalen-1-yl)-N,N'-bis(phenyl)-9,9-dimethylfluorene);

DPFL-TPD (N,N'-bis(3-methylphenyl)-N,N'-bis(phenyl)-9,9-diphenylfluorene);

DPFL-NPB (N,N'-bis(naphthalen-1-yl)-N,N'-bis(phenyl)-9,9-diphenylfluorene);

spiro-TAD (2,2',7,7'-tetrakis(N,N-diphenylamino)-9,9'-spirobifluorene);

9,9-bis[4-(N,N-bis-biphenyl-4-yl-amino)phenyl]-9H-fluorene;

9,9-bis[4-(N,N-bis-naphthalen-2-yl-amino)phenyl]-9H-fluorene;

9,9-bis[4-(N,N'-bis-naphthalen-2-yl-N,N'-bis-phenylamino)phenyl]-9H-fluorene;

N,N'-bis(phenanthren-9-yl)-N,N'-bis(phenyl)benzidine;

2,7-bis[N,N-bis(9,9-spiro-bifluoren-2-yl)amino]-9,9-spiro-bifluorene;

2,2'-bis[N,N-bis(biphenyl-4-yl)amino]9,9-spiro-bifluorene;

2,2'-bis(N,N-diphenylamino)-9,9-spiro-bifluorene;

di-[4-(N,N-ditolylamino)phenyl]cyclohexane;

2,2',7,7'-tetra(N,N-ditolyl)amino-spiro-bifluorene; and

N,N,N',N'-tetra-naphthalen-2-yl-benzidine.

The hole injection layer 202 can have a layer thickness in a range of approximately 10 nm to approximately 1000 nm, for example in a range of approximately 30 nm to approximately 300 nm, for example in a range of approximately 50 nm to approximately 200 nm.

A first hole transport layer 204 can be applied, for example deposited, on or above the hole injection layer 202. In various embodiments, the first hole transport layer 204 may include or consist of one or more of the following materials:

NPB (N,N'-bis(naphthalen-1-yl)-N,N'-bis(phenyl)benzidine);

beta-NPB N,N'-bis(naphthalen-2-yl)-N,N'-bis(phenyl) benzidine); TPD (N,N'-bis(3-methylphenyl)-N,N'-bis (phenyl)benzidine); spiro TPD (N,N'-bis(3-methylphenyl)-N,N'-bis(phenyl)benzidine);

spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);

DMFL-NPB (N,N'-bis(naphthalen-1-yl)-N,N'-bis(phenyl)-9,9-dimethylfluorene);

DPFL-TPD (N,N'-bis(3-methylphenyl)-N,N'-bis(phenyl)-9,9-diphenylfluorene);

DPFL-NPB (N,N'-bis(naphthalen-1-yl)-N,N'-bis(phenyl)-9,9-diphenylfluorene);

spiro-TAD (2,2',7,7'-tetrakis(N,N-diphenylamino)-9,9'-spirobifluorene);

9,9-bis[4-(N,N-bis-biphenyl-4-yl-amino)phenyl]-9H-fluorene;

9,9-bis[4-(N,N-bis-naphthalen-2-yl-amino)phenyl]-9H-fluorene;

9,9-bis[4-(N,N'-bis-naphthalen-2-yl-N,N'-bis-phenylamino)phenyl]-9H-fluorene;

N,N'-bis(phenanthren-9-yl)-N,N'-bis(phenyl)benzidine;

2,7-bis[N,N-bis(9,9-spiro-bifluoren-2-yl)amino]-9,9-spiro-bifluorene;

2,2'-bis[N,N-bis(biphenyl-4-yl)amino]9,9-spiro-bifluorene;

2,2'-bis(N,N-diphenylamino)-9,9-spiro-bifluorene;

di-[4-(N,N-ditolylamino)phenyl]cyclohexane;

2,2',7,7'-tetra(N,N-ditolyl)amino-spiro-bifluorene; and

N,N,N',N'-tetra-naphthalen-2-yl-benzidine.

The first hole transport layer 204 can have a layer thickness in a range of approximately 5 nm to approximately 50 nm, for example in a range of approximately 10 nm to approximately 30 nm, for example approximately 20 nm.

A first emitter layer 206 can be applied, for example deposited, on or above the hole transport layer 204. The emitter materials which can be provided for example for the first emitter layer 206 are described above. In various embodiments, the first emitter layer 206 can have a layer thickness in a range of approximately 5 nm to approximately 50 nm, for example in a range of approximately 10 nm to approximately 30 nm, for example in a range of approximately 15 nm to approximately 25 nm, for example approximately 20 nm.

Furthermore, a first electron transport layer 208 can be arranged, for example deposited, on or above the first emitter layer 206. In various embodiments, the first electron transport layer 208 may include or consist of one or more of the following materials:

NET-18

2,2',2"-(1,3,5-benzinetriyl)-tris(1-phenyl-1-H-benzimidazole);

2-(4-biphenylyl)-5-(4-tert-butylphenyl)-1,3,4-oxadiazole, 2,9-dimethyl-4,7-diphenyl-1,10-phenanthroline (BCP);

8-hydroxyquinolinolatolithium, 4-(naphthalen-1-yl)-3,5-diphenyl-4H-1,2,4-triazole;

1,3-bis[2-(2,2'-bipyridin-6-yl)-1,3,4-oxadiazo-5-yl]benzene;

4,7-diphenyl-1,10-phenanthroline (Bphen);

3-(4-biphenylyl)-4-phenyl-5-tert-butylphenyl-1,2,4-triazole;

bis(2-methyl-8-quinolinolate)-4-(phenylphenolato)aluminum;

6,6'-bis[5-(biphenyl-4-yl)-1,3,4-oxadiazo-2-yl]-2,2'-bipyridyl;

2-phenyl-9,10-di(naphthalen-2-yl)anthracene;

2,7-bis[2-(2,2'-bipyridin-6-yl)-1,3,4-oxadiazo-5-yl]-9,9-dimethylfluorene;

1,3-bis[2-(4-tert-butylphenyl)-1,3,4-oxadiazo-5-yl]benzene;

2-(naphthalen-2-yl)-4,7-diphenyl-1,10-phenanthroline;

2,9-bis(naphthalen-2-yl)-4,7-diphenyl-1,10-phenanthroline;

tris(2,4,6-trimethyl-3-(pyridin-3-yl)phenyl)borane;

1-methyl-2-(4-(naphthalen-2-yl)phenyl)-1H-imidazo[4,5-f][1,10]phenanthroline;

phenyl-dipyrenylphosphine oxide;

naphthalenetetracarboxylic dianhydride or the imides thereof;

perylenetetracarboxylic dianhydride or the imides thereof; and substances based on silols including a silacyclopentadiene unit.

The first electron transport layer 208 can have a layer thickness in a range of approximately 5 nm to approximately 50 nm, for example in a range of approximately 10 nm to approximately 30 nm, for example in a range of approximately 15 nm to approximately 25 nm, for example approximately 20 nm.

As described above, the (optional) hole injection layer 202, the (optional) first hole transport layer 204, the first emitter layer 206, and the (optional) first electron transport layer 208 form the first organic functional layer structure 112.

A charge generating layer structure (CGL) 114 is arranged on or above the first organic functional layer structure 112, and will be described in even greater detail below.

In various embodiments, the second organic functional layer structure 116 is arranged on or above the charge generating layer structure 114.

In various embodiments, the second organic functional layer structure 116 may include a second hole transport layer 210, wherein the second hole transport layer 210 is arranged on or above the charge generating layer structure 114. By way of example, the second hole transport layer 210 can be in physical contact with the surface of the charge generating layer structure 114; to put it another way, they share a common interface. In various embodiments, the second hole transport layer 210 or hole-conducting charge generating layer 210 may include or consist of one or more of the following materials:

NPB (N,N'-bis(naphthalen-1-yl)-N,N'-bis(phenyl)benzidine);

beta-NPB N,N'-bis(naphthalen-2-yl)-N,N'-bis(phenyl) benzidine); TPD (N,N'-bis(3-methylphenyl)-N,N'-bis(phenyl)benzidine); spiro TPD (N,N'-bis(3-methylphenyl)-N,N'-bis(phenyl)benzidine);

spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethylfluorene);

DMFL-NPB (N,N'-bis(naphthalen-1-yl)-N,N'-bis(phenyl)-9,9-dimethylfluorene);

DPFL-TPD (N,N'-bis(3-methylphenyl)-N,N'-bis(phenyl)-9,9-diphenylfluorene);

DPFL-NPB (N,N'-bis(naphthalen-1-yl)-N,N'-bis(phenyl)-9,9-diphenylfluorene);

spiro-TAD (2,2',7,7'-tetrakis(N,N-diphenylamino)-9,9'-spirobifluorene);

9,9-bis[4-(N,N-bis-biphenyl-4-yl-amino)phenyl]-9H-fluorene;

9,9-bis[4-(N,N-bis-naphthalen-2-yl-amino)phenyl]-9H-fluorene;

9,9-bis[4-(N,N'-bis-naphthalen-2-yl-N,N'-bis-phenylamino)phenyl]-9H-fluorene;

N,N'-bis(phenanthren-9-yl)-N,N'-bis(phenyl)benzidine;

2,7-bis[N,N-bis(9,9-spiro-bifluoren-2-yl)amino]-9,9-spiro-bifluorene;

2,2'-bis[N,N-bis(biphenyl-4-yl)amino]9,9-spiro-bifluorene;

2,2'-bis(N,N-diphenylamino)-9,9-spiro-bifluorene;

di-[4-(N,N-ditolylamino)phenyl]cyclohexane;

2,2',7,7'-tetra(N,N-ditolyl)amino-spiro-bifluorene; and

N,N,N',N'-tetra-naphthalen-2-yl-benzidine.

The second hole transport layer 210 can have a layer thickness in a range of approximately 5 nm to approximately 50 nm, for example in a range of approximately 15 nm to approximately 40 nm, for example in a range of approximately 20 nm to approximately 30 nm.

Furthermore, the second organic functional layer structure 116 may include a second emitter layer 212, which can be arranged on or above the second hole transport layer 210. The second emitter layer 212 may include the same emitter materials as the first emitter layer 206. Alternatively, the second emitter layer 212 and the first emitter layer 206 may include different emitter materials. In various embodiments, the second emitter layer 212 can be designed in such a way that it emits electromagnetic radiation, for example visible light, having the same wavelength(s) as the first emitter layer 206. Alternatively, the second emitter layer 212 can be designed in such a way that it emits electromagnetic radiation, for example visible light, having a different wavelength or different wavelengths than the first emitter layer 206. The emitter materials of the second emitter layer can be materials such as have been described above.

Other suitable emitter materials can, of course, be provided both for the first emitter layer 206 and for the second emitter layer 212.

Furthermore, the second organic functional layer structure 116 may include a second electron transport layer 214, which can be arranged, for example deposited, on or above the second emitter layer 212.

In various embodiments, the second electron transport layer 214 may include or consist of one or more of the following materials:

NET-18
2,2',2''-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazol-5-yl]benzene;
4,7-diphenyl-1,10-phenanthroline (Bphen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

The second electron transport layer 214 can have a layer thickness in a range of approximately 10 nm to approximately 50 nm, for example in a range of approximately 15 nm to approximately 40 nm, for example in a range of approximately 20 nm to approximately 30 nm.

Furthermore, an electron injection layer 216 can be applied, for example deposited, on or above the second electron transport layer 214.

In various embodiments, the electron injection layer 216 may include or consist of one or more of the following materials:

NDN-26, MgAg, $Cs_2CO_3$, $Cs_3PO_4$, Na, Ca, K, Mg, Cs, Li, LiF;
2,2',2''-(1,3,5-benzinetriyl)-tris(1-phenyl-1-H-benzimidazole);
2-(4-biphenylyl)-5-(4-tert-butylphenyl)-1,3,4-oxadiazole, 2,9-dimethyl-4,7-diphenyl-1,10-phenanthroline (BCP);
8-hydroxyquinolinolatolithium, 4-(naphthalen-1-yl)-3,5-diphenyl-4H-1,2,4-triazole;
1,3-bis[2-(2,2'-bipyridin-6-yl)-1,3,4-oxadiazol-5-yl]benzene;
4,7-diphenyl-1,10-phenanthroline (Bphen);
3-(4-biphenylyl)-4-phenyl-5-tert-butylphenyl-1,2,4-triazole;
bis(2-methyl-8-quinolinolate)-4-(phenylphenolato)aluminum;
6,6'-bis[5-(biphenyl-4-yl)-1,3,4-oxadiazo-2-yl]-2,2'-bipyridyl;
2-phenyl-9,10-di(naphthalen-2-yl)anthracene;
2,7-bis[2-(2,2'-bipyridin-6-yl)-1,3,4-oxadiazo-5-yl]-9,9-dimethylfluorene;
1,3-bis[2-(4-tert-butylphenyl)-1,3,4-oxadiazo-5-yl]benzene;
2-(naphthalen-2-yl)-4,7-diphenyl-1,10-phenanthroline;
2,9-bis(naphthalen-2-yl)-4,7-diphenyl-1,10-phenanthroline;
tris(2,4,6-trimethyl-3-(pyridin-3-yl)phenyl)borane;
1-methyl-2-(4-(naphthalen-2-yl)phenyl)-1H-imidazo[4,5-f][1,10]phenanthroline;
phenyl-dipyrenylphosphine oxide;
naphthalenetetracarboxylic dianhydride or the imides thereof;
perylenetetracarboxylic dianhydride or the imides thereof; and
substances based on silols including a silacyclopentadiene unit.

The electron injection layer 216 can have a layer thickness in a range of approximately 5 nm to approximately 200 nm, for example in a range of approximately 20 nm to approximately 50 nm, for example approximately 30 nm.

As described above, the (optional) second hole transport layer 210, the second emitter layer 212, the (optional) second electron transport layer 214, and the (optional) electron injection layer 216 form the second organic functional layer structure 116.

In various embodiments, the organic electroluminescent layer structure 110 (that is to say for example the sum of the thicknesses of hole transport layer(s) and emitter layer(s) and electron transport layer(s), etc.) can have a layer thickness of a maximum of approximately 1.5 μm, for example a layer thickness of a maximum of approximately 1.2 μm, for example a layer thickness of a maximum of approximately 1 μm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of a plurality of organic light emitting diodes (OLEDs) arranged directly one above another, wherein each OLED can have for example a layer thickness of a maximum of approximately 1.5 μm, for example a layer thickness of a maximum of approximately 1.2 μm, for example a layer thickness of a maximum of approximately 1 μm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 110 can have for example a stack of two, three or four OLEDs arranged directly one above another, in which case for example the organic electroluminescent layer structure 110 can have a layer thickness of a maximum of approximately 3 μm.

The light emitting component 100 may optionally generally include further organic functional layers, for example arranged on or above the one or the plurality of emitter layers or on or above the electron transport layer(s), which serve to further improve the functionality and thus the efficiency of the light emitting component 100.

The second electrode 108 (for example in the form of a second electrode layer 108) can be applied on or above the organic electroluminescent layer structure 110 or, if appropriate, on or above the one or the plurality of further organic functional layers, as described above.

In various embodiments, the second electrode 108 may include or be formed from the same materials as the first electrode 106, metals being particularly suitable in various embodiments.

In various embodiments, the second electrode 108 (for example for the case of a metallic second electrode 108) can have for example a layer thickness of less than or equal to approximately 2000 nm, for example a layer thickness of less than or equal to approximately 1000 nm, for example a layer thickness of less than or equal to approximately 500 nm, for example a layer thickness of less than or equal to approximately 250 nm, for example a layer thickness of less than or equal to approximately 200 nm, for example a layer thickness of less than or equal to approximately 100 nm, for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 108 can generally be formed in a similar manner to the first electrode 106, or differently than the latter. In various embodiments, the second electrode 108 can be formed from one or more of the materials and with the respective layer thickness, as described above in connection with the first electrode 106. In various embodiments, both the first electrode 106 and the second electrode 108 are formed as translucent or transparent. Consequently, the light emitting component 100 illustrated in FIG. 1 can be designed as a top and bottom emitter (to put it another way as a transparent light emitting component 100).

The second electrode 108 can be formed as an anode, that is to say as a hole-injecting electrode, or as a cathode, that is to say as an electron-injecting electrode.

The second electrode 108 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 118, for example in the form of a barrier thin-film layer/thin-film encapsulation 118, can optionally also be formed on or above the second electrode 108 and thus on or above the electrically active region 104.

In the context of this application, a "barrier thin-film layer" or a "barrier thin film" 118 can be understood to mean, for example, a layer or a layer structure which is suitable for forming a barrier against chemical impurities or atmospheric substances, in particular against water (moisture) and oxygen. In other words, the barrier thin-film layer 118 is formed in such a way that OLED-damaging substances such as water, oxygen or solvent cannot penetrate through it or at most very small proportions of said substances can penetrate through it.

In accordance with one configuration, the barrier thin-film layer 118 can be formed as an individual layer (to put it another way, as a single layer). In accordance with an alternative configuration, the barrier thin-film layer 118 may include a plurality of partial layers formed one on top of another. In other words, in accordance with one configuration, the barrier thin-film layer 118 can be formed as a layer stack. The barrier thin-film layer 118 or one or a plurality of partial layers of the barrier thin-film layer 118 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 118 having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer 118 including a plurality of partial layers, one or a plurality of partial layers of the barrier thin-film layer 118 can be deposited by means of a different deposition method than an atomic layer deposition method, for example by means of a vapor deposition method.

In accordance with one configuration, the barrier thin-film layer 118 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 118 includes a plurality of partial layers, all the partial layers can have the same layer thickness. In accordance with another configuration, the individual partial layers of the barrier thin-film layer 118 can have different layer thicknesses. In other words, at least one of the partial layers can have a different layer thickness than one or more other partial layers.

In accordance with one configuration, the barrier thin-film layer 118 or the individual partial layers of the barrier thin-film layer 118 can be formed as a translucent or transparent layer. In other words, the barrier thin-film layer 118 (or the individual partial layers of the barrier thin-film layer 118) can consist of a translucent or transparent material (or a material combination that is translucent or transparent).

In accordance with one configuration, the barrier thin-film layer 118 or (in the case of a layer stack having a plurality of partial layers) one or a plurality of the partial layers of the barrier thin-film layer 118 may include or consist of one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 118 or (in the case of a layer stack having a plurality of partial layers) one or a plurality of the partial layers of the barrier thin-film layer 118 may include one or a plurality of high refractive index materials, to put it another way one or a plurality of materials having a high refractive index, for example having a refractive index of at least 2.

In various embodiments, on or above the encapsulation 118, it is possible to provide an adhesive and/or a protective lacquer 120, by means of which, for example, a cover 122 (for example a glass cover 122) is fixed, for example adhesively bonded, on the encapsulation 118. In various embodiments, the optically translucent layer composed of adhesive and/or protective lacquer 120 can have a layer thickness of greater than 1 µm, for example a layer thickness of several µm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_a$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 108 and the layer composed of adhesive and/or protective lacquer 120, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

Furthermore, it should be pointed out that, in various embodiments, an adhesive 120 can also be completely dispensed with, for example in embodiments in which the cover 122, for example composed of glass, is applied to the encapsulation 118 by means of plasma spraying, for example.

Furthermore, in various embodiments, one or a plurality of antireflective layers (for example combined with the encapsulation 118, for example the thin-film encapsulation 118) can additionally be provided in the light emitting component 100.

Figure 3:
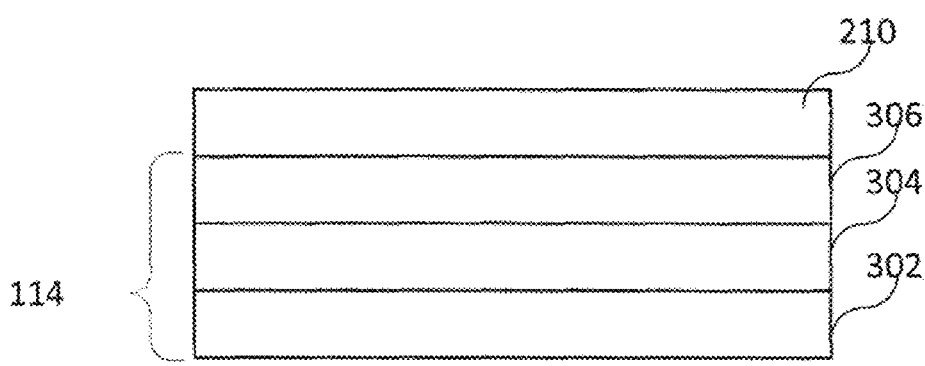
FIG. 3 shows a cross-sectional view of a charge generating layer structure of an optoelectronic component in accordance with various embodiments.

FIG. 3 illustrates the construction of a charge generating layer 114 in accordance with various embodiments in a cross-sectional view.

In various embodiments, the charge generating layer structure 114 may include a second electron-conducting charge generating layer 302 and a first electron-conducting charge generating layer 306, wherein the second electron-conducting charge generating layer 302 can be arranged on or above the first electron transport layer 208, for example can be in physical contact with the latter. The first electron-conducting charge generating layer 306 can be arranged on or above the second electron-conducting charge generating layer 302, wherein an interlayer 304 can optionally be provided between these two layers 302, 306. The second hole transport layer 210 can be arranged on or above the first electron-conducting charge generating layer 306, wherein the hole transport layer 210 can also be designed as hole-conducting charge generating layer 210 by virtue of charge carrier pairs being generated and separated at the common interface of first electron-conducting charge generating layer 306 and hole transport layer 210.

In the case of a direct connection between the first electron-conducting charge generating layer 306 and the second electron-conducting charge generating layer 302, formation of a space charge zone (a so-called pn junction) can occur. In various embodiments, the charge generating layer structure 114 can be augmented by the interlayer 304 between the charge generating layers 302, 306, in order to prevent partial layer interdiffusion between the charge generating layers 302, 306.

In a manner similar to inorganic layers at high temperatures in the manufacture of semiconductor components, for example at temperatures of greater than 200° C., during manufacture and during operation even at temperatures of less than 100° C. organic layers can diffuse into other layers (partial layer interdiffusion), e.g. parts of the second electron-conducting charge generating layer 302 into the first electron-conducting charge generating layer 306 of a charge generating layer structure 114 in an optoelectronic component, for example an OLED. In order to suppress the partial layer interdiffusion (that is to say, illustratively, to achieve a barrier effect), the interlayer 304 can be inserted between the individual organic layers, e.g. between the first electron-conducting charge generating layer 306 and the second electron-conducting charge generating layer 302.

By way of example, if the substance of the first electron-conducting charge generating layer 306 or of the second electron-conducting charge generating layer 302 is inorganic, then an interlayer 304 may not be necessary, since layer interdiffusion is not significant.

In various embodiments, the second electron-conducting charge generating layer 302 can be composed of a single substance (for this reason, the electron-conducting charge generating layer 302 can also be designated as an undoped second electron-conducting charge generating layer 302). The substance forming the second electron-conducting charge generating layer 302, that is to say for example the substance of which the second electron-conducting charge generating layer 302 consists, can have a high electron conductivity (for example an electron conductivity of an order of magnitude of for example better than approximately $10^{-7}$ S/m, for example better than approximately $10^{-6}$ S/m, for example better than approximately $10^{-5}$ S/m). Furthermore, the substance of the electron-conducting charge generating layer 302 can have a low work function (for example a work function of less than or equal to approximately 3 eV) and a low absorption of visible light. In various embodiments, as substance of the second electron-conducting charge generating layer 302 it is possible to provide any substance which fulfills these stated conditions, for example NDN-26, MgAg, $Cs_2CO_3$, $Cs_3PO_4$, Na, Ca, K, Mg, Cs, Li, LiF.

In various embodiments, the second electron-conducting charge generating layer 302 can have a layer thickness in a range of approximately 1 nm to approximately 500 nm, for example in a range of approximately 3 nm to approximately 100 nm, for example in a range of approximately 10 nm to approximately 90 nm, for example in a range of approximately 20 nm to approximately 80 nm, for example in a range of approximately 30 nm to approximately 70 nm, for example in a range of approximately 40 nm to approximately 60 nm, for example a layer thickness of approximately 50 nm.

In various embodiments, the first electron-conducting charge generating layer 306 can be composed of a plurality of substances, that is to say for example a substance mixture, or likewise of a single substance (for this reason, the first electron-conducting charge generating layer 306 can also be designated as an undoped first electron-conducting charge generating layer 306). The substance forming the first electron-conducting charge generating layer 306, that is to say for example the substance of which the first electron-conducting charge generating layer 306 consists, can have a high conductivity (for example a conductivity of an order of magnitude of for example better than approximately $10^{-5}$ S/m, for example better than approximately $10^{-4}$ S/m, for example better than approximately $10^{-3}$ S/m). Furthermore, the substance of the first electron-conducting charge generating layer 306 can have a high work function, for example a work function in a range of approximately 5.0 eV to approximately 5.5 eV, and a low absorption of visible light. In various embodiments, as substance of the first electron-conducting charge generating layer 306 it is possible to provide any material or any substance which fulfills these stated conditions, for example HAT-CN, Cu(I)pFBz, $MoO_x$, $WO_x$, $VO_x$, $ReO_x$, F4-TCNQ, NDP-2, NDP-9, Bi(III)pFBz, F16CuPc.

In various embodiments, the first electron-conducting charge generating layer 306 can have a layer thickness in a range of approximately 1 nm to approximately 500 nm, for example in a range of approximately 3 nm to approximately 100 nm, for example in a range of approximately 10 nm to approximately 90 nm, for example in a range of approximately 20 nm to approximately 80 nm, for example in a range of approximately 30 nm to approximately 70 nm, for example in a range of approximately 40 nm to approximately 60 nm, for example a layer thickness of approximately 50 nm.

In various embodiments, the first electron-conducting charge generating layer 306 may include a substance or substance mixture having high conductivity and a conduction band (Lowest Unoccupied Molecule Orbital, LUMO) which is energetically approximately equal relative to the valence band (Highest Occupied Molecule Orbital, HOMO) of the directly or indirectly adjacent hole transport layer 210 or hole-conducting charge generating layer 210 and the valence band of the second electron-conducting charge generating layer 302. To put it another way, the substance or the substance mixture of the first electron-conductive charge generating layer 306 has a LUMO that is energetically approximately at the same level as the HOMO of the substance or substance mixture of the hole transport layer 210 and the HOMO of the second electron-conducting charge generating layer 302.

In this case, the charge carrier pair is generated and separated at the common interface of the hole transport layer 210 with the first electron-conducting charge generating layer 306 in such a way that the hole of the charge carrier pair generated is transported in the hole transport layer 210 to the emitter layer 212 of the second organic functional layer structure 116, and wherein the electron of the charge carrier pair generated is transported by means of the first electron-conducting charge generating layer 306 and second charge generating layer 302 to the first emitter layer 206 of the first organic functional layer structure 112. In other words, the hole transport layer 210 can additionally be designed as a hole-conducting charge generating layer 210.

The interlayer 304 can have a layer thickness in a range of approximately 1 nm to approximately 200 nm, for example in a range of approximately 3 nm to approximately 100 nm, for example in a range of approximately 5 nm to approximately 10 nm, for example a layer thickness of approximately 6 nm. The charge carrier conduction through the interlayer 304 can take place directly or indirectly.

The substance or the substance mixture of the interlayer 304 can be an electrical insulator in the case of an indirect charge carrier conduction. The HOMO of the electrically insulating substance of the interlayer 304 can be higher than the LUMO of the directly adjacent first electron-conducting charge generating layer 306 and higher than the HOMO of the directly adjacent second electron-conducting charge generating layer 302. A tunneling current through the interlayer 304 can be effected as a result.

Suitable substances for the interlayer 304 are phthalocyanine derivatives, for example vanadium oxide phthalocyanine (VOPc), titanium oxide phthalocyanine (TiOPc); copper phthalocyanine (CuPc), unsubstituted phthalocyanine ($H_2Pc$), cobalt phthalocyanine (CoPc), aluminum phthalocyanine (AlPc), nickel phthalocyanine (NiPc), iron phthalocyanine (FePc), zinc phthalocyanine (ZnPc) or manganese phthalocyanine (MnPC).

In a first specific implementation of various embodiments, which, however, is not intended to be of any restrictive character whatsoever, the charge generating layer structure 114 includes the following layers:
  second electron-conducting charge generating layer 302:
  NDN-26 having a layer thickness of approximately 10 nm,
  interlayer 304:
  VOPc having a layer thickness of approximately 6 nm; and
  first electron-conducting charge generating layer 306:
  HAT-CN having a layer thickness of approximately 5 nm.

In this implementation, the first electron transport layer 208 may include NET-18 having a layer thickness of approximately 100 nm. Furthermore, the second hole transport layer 210 in this implementation may include HT-508 having a layer thickness of approximately 100 nm.

In a second specific implementation of various embodiments, which, however, is not intended to be of any restrictive character whatsoever, the charge generating layer structure 114 includes the following layers:
  second electron-conducting charge generating layer 302:
  MgAg having a layer thickness of approximately 3 nm;
  no interlayer 304; and
  first electron-conducting charge generating layer 306:
  HAT-CN having a layer thickness of approximately 15 nm.

In this implementation, the first electron transport layer 208 may include NET-18 having a layer thickness of approximately 50 nm. Furthermore, the second hole transport layer 210 in this implementation may include NPB having a layer thickness of approximately 25 nm.

Figure 4:
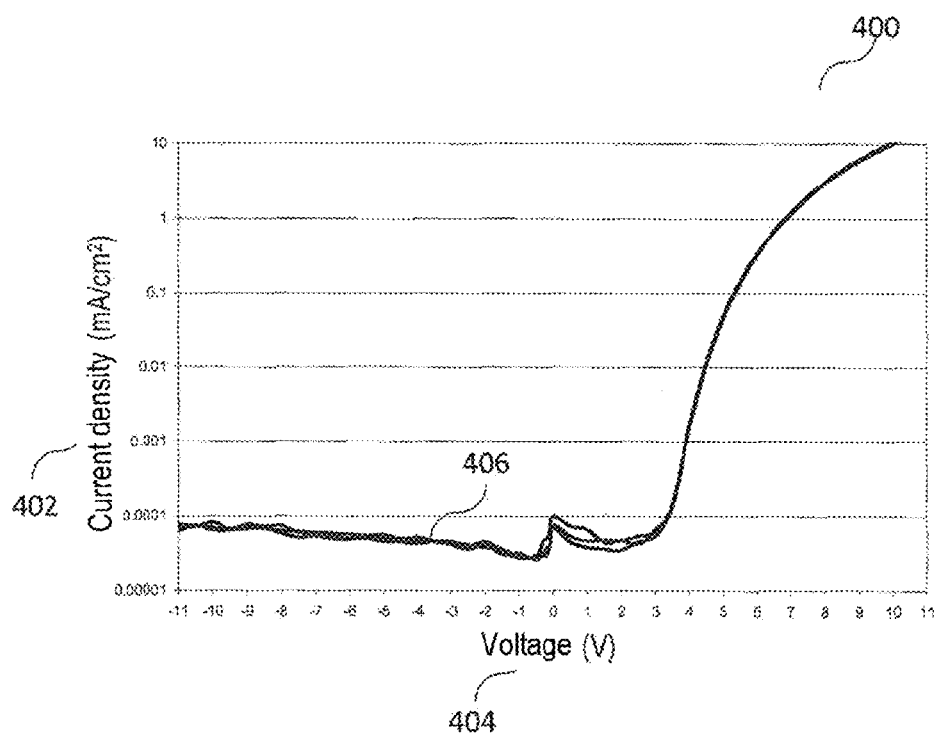
FIG. 4 shows a plurality of measured current-voltage characteristic curves of a charge generating layer structure in accordance with a first implementation.

FIG. 4 shows a plurality of current-voltage characteristic curves of a charge generating layer structure in accordance with the first specific implementation of the charge generating layer structure 114 in a current-voltage diagram 400 illustrating the measured current density 402 as a function of the applied voltage 404 in a characteristic curve 406. It is evident that the characteristic curve 406 has the form of a characteristic curve of a pn diode.

Figure 5:
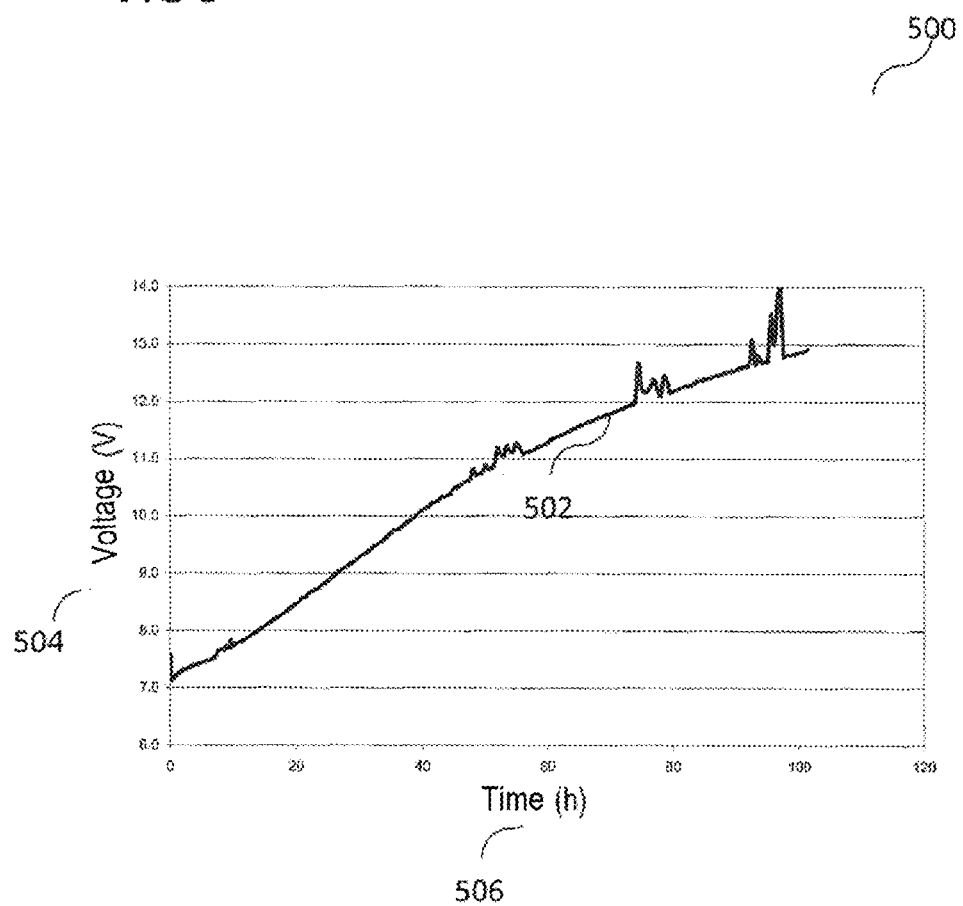
FIG. 5 shows a measured temperature/voltage stability of a charge generating layer structure in accordance with the first implementation.

FIG. 5 shows a measured temperature/voltage stability characteristic curve 502 of a charge generating layer structure in accordance with the first implementation in a temperature/voltage diagram 500, wherein the measured voltage 504 is illustrated as a function of time 506 at a predefined temperature of approximately 85° C.

Figure 6:
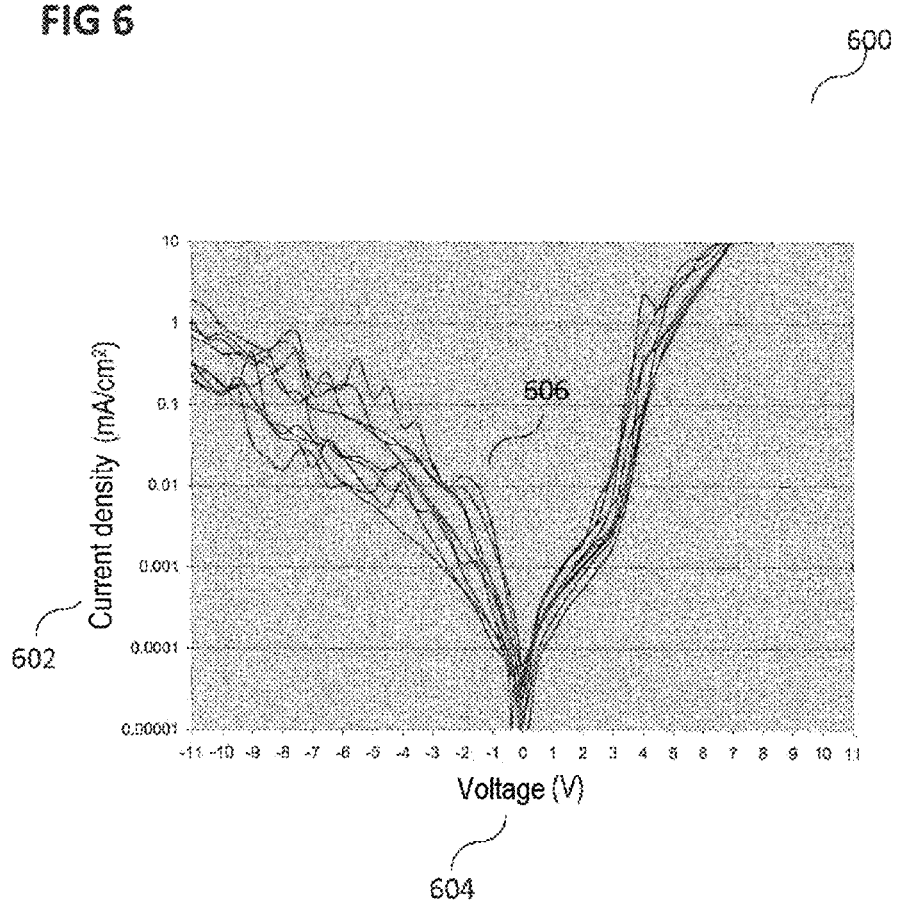
FIG. 6 shows a plurality of current-voltage characteristic curves of a charge generating layer structure in accordance with a second implementation.

FIG. 6 shows a plurality of current-voltage characteristic curves of a charge generating layer structure in accordance with the second specific implementation of the charge generating layer structure 114 in a current-voltage diagram 600 illustrating the measured current density 602 as a function of the applied voltage 604 in a characteristic curve 606. It is evident that the characteristic curve 606 has the form of a characteristic curve of a pn diode.

Figure 7:
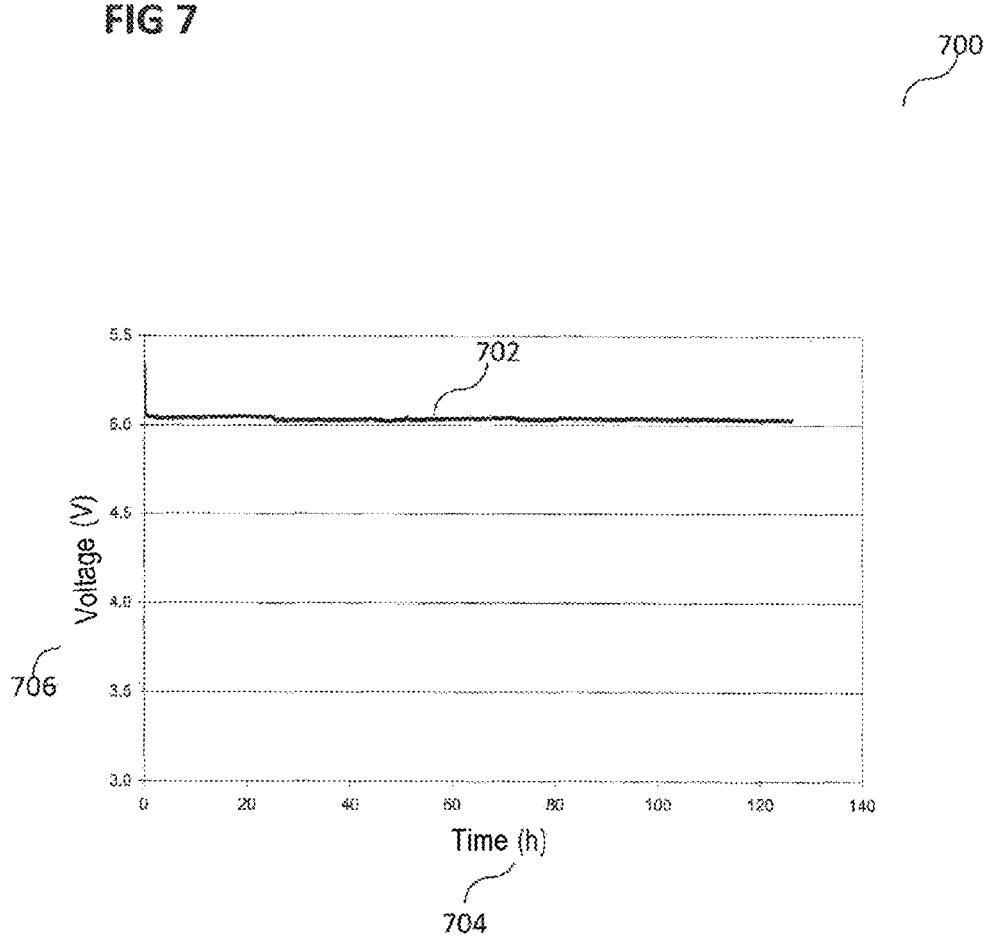
FIG. 7 shows a measured temperature/voltage stability of a charge generating layer structure in accordance with the second implementation.

FIG. 7 shows measured temperature/voltage stability characteristic curves 702 of a charge generating layer structure 114 in accordance with the second implementation in a temperature/voltage diagram 700, wherein the measured voltage 706 is illustrated as a function of time 704 at a temperature of approximately 75° C.

In various embodiments, for an optoelectronic component, for example for an OLED, a charge generating layer structure is provided, wherein the second electron-conducting charge generating layer is formed from a single substance and thus without doped layers; to put it another way, no layer having a dopant in a matrix is realized. In various embodiments, the first electron-conducting charge generating layer can also be formed from a single substance and thus without doped layers (alternatively, however, the first electron-conducting charge generating layer can also be realized in the form of a matrix having a dopant).

In this case, the first electron-conducting charge generating layer and the second electron-conducting charge generating layer can be vapor-deposited one above another as pure organic layers. In order to suppress the reaction of the two highly reactive layers, a thin interlayer 304 can optionally be inserted between the two layers.

A process engineering advantage of this approach in accordance with various embodiments can be seen in the fact that for the first electron-conducting charge generating layer and/or for the second electron-conducting charge generating layer in each case only one evaporation source (also designated as substance source) is required. In the case of a conventional doping of the charge generating layers, two separate substance sources for the matrix and for the dopant are always required both in the first electron-conducting charge generating layer and in the second electron-conducting charge generating layer. This affords advantages in terms of the process implementation for the various embodiments, since the reduction of the substance sources means a lower outlay in terms of process control, fewer fault sources (increase in yield) and a lower energy consumption.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a first organic functional layer structure;
a second organic functional layer structure; and
a charge generating layer structure between the first organic functional layer structure and the second organic functional layer structure,
wherein the charge generating layer structure comprises:
a first electron-conducting charge generating layer; and
a second electron-conducting charge generating layer, wherein the second electron-conducting charge generating layer is formed from a single substance, and
wherein the substance of the first electron-conducting charge generating layer is a substance selected from the group of substances consisting of: HAT-CN, Cu(I)pFBz, NDP-2, NDP-9, Bi(III)pFBz, F16CuPc.

2. The optoelectronic component as claimed in claim 1, wherein the first electron-conducting charge generating layer is an intrinsic electron-conducting charge generating layer.

3. The optoelectronic component as claimed in claim 1, wherein the first electron-conducting charge generating layer is formed from a single substance.

4. The optoelectronic component as claimed in claim 1, wherein the substance of the second electron-conducting charge generating layer is a substance selected from the group of substances consisting of: NDN-26, MgAg, $Cs_2CO_3$, $Cs_3PO_4$, Na, Ca, K, Mg, Cs, Li, LiF.

5. The optoelectronic component as claimed in claim 1, further comprising:
an interlayer arranged between the first electron-conducting charge generating layer and the second electron-conducting charge generating layer.

6. The optoelectronic component as claimed in claim 5, wherein the interlayer comprises a phthalocyanine derivative.

7. The optoelectronic component as claimed in claim 1, further comprising:
a hole transport layer arranged on or above the first electron-conducting charge generating layer; and
an electron transport layer;
wherein the second electron-conducting charge generating layer is arranged on or above the electron transport layer.

8. The optoelectronic component as claimed in claim 7, wherein the hole transport layer is formed from an intrinsically hole-conducting substance or from a substance mixture comprising matrix and p-type dopant.

9. The optoelectronic component as claimed in claim 1, further comprising:
a first electrode;
wherein the first organic functional layer structure is arranged on or above the first electrode;
a second electrode;
wherein the second electrode is arranged on or above the second organic functional layer structure.

10. The optoelectronic component as claimed in claim 1, designed as an organic light emitting diode.

11. A method for producing an optoelectronic component, the method comprising:
forming a first organic functional layer structure;
forming a charge generating layer structure on or above or on the first organic functional layer structure;
forming a second organic functional layer structure on or above the charge generating layer structure, wherein said forming the charge generating layer structure comprises:
forming a second electron-conducting charge generating layer on or above the first organic functional layer structure, wherein the second electron-conducting charge generating layer is formed from a single substance; and
forming a first electron-conducting charge generating layer on or above the electron-conducting charge generating layer, and
wherein the substance of the first electron-conducting charge generating layer is a substance selected from the group of substances consisting of: HAT-CN, Cu(I)pFBz, NDP-2, NDP-9, Bi(III)pFBz, F16CuPc.

12. The method as claimed in claim 11,
wherein the substance of the second electron-conducting charge generating layer is a substance selected from the group of substances consisting of: NDN-26, MgAg, $Cs_2CO_3$, $Cs_3PO_4$, Na, Ca, K, Mg, Cs, Li, LiF.

13. The method as claimed in claim 11, further comprising:
 forming an electron transport layer;
 forming the second electron-conducting charge generating layer on or above the electron transport layer;
 forming a hole transport layer on or above the first electron-conducting charge generating layer.

14. The method as claimed in claim 11, further comprising:
 forming a first electrode;
 forming the first organic functional layer structure on or above the first electrode;
 forming a second electrode on or above the second organic functional layer structure.

15. The method as claimed in claim 11,
wherein the second electron-conducting charge generating layer is formed on the first organic functional layer structure; and wherein the conductivity of the electron-conducting charge generating layer is increased; and/or
wherein the first electron-conducting charge generating layer is formed on the second electron-conducting charge generating layer or an interlayer; and wherein the conductivity of the second electron-conducting charge generating layer is increased.

16. The method as claimed in claim 15,
wherein the conductivity is increased by means of irradiation with electromagnetic radiation and/or by means of the action of a temperature change.

17. The method as claimed in claim 11,
wherein the optoelectronic component is produced as an organic light emitting diode.

\* \* \* \* \*